US012776629B2

(12) United States Patent
Salsi et al.

(10) Patent No.: US 12,776,629 B2
(45) Date of Patent: Oct. 27, 2026

(54) POLARIZATION-INSENSITIVE OPTICAL AMPLIFIER

(71) Applicant: Google LLC, Mountain View, CA (US)

(72) Inventors: Massimiliano Salsi, Sunnyvale, CA (US); Valey Kamalov, Gainesville, FL (US); Giorgio Grasso, Lesmo (IT); Aldo Righetti, Milan (IT); Alessandro Petocchi, Mirandola (IT)

(73) Assignee: Google LLC, Mountain View, CA (US)

( * ) Notice: Subject to any disclaimer, the term of this patent is extended or adjusted under 35 U.S.C. 154(b) by 587 days.

(21) Appl. No.: 18/227,667

(22) Filed: Jul. 28, 2023

(65) Prior Publication Data

US 2024/0356310 A1 Oct. 24, 2024

(30) Foreign Application Priority Data

Apr. 20, 2023 (IT) ........................ 102023000007764

(51) Int. Cl.
*H01S 5/50* (2006.01)
*H01S 5/02251* (2021.01)

(52) U.S. Cl.
CPC ........ *H01S 5/5036* (2013.01); *H01S 5/02251* (2021.01)

(58) Field of Classification Search
CPC .. H01S 5/5036; H01S 5/02251; H01S 5/5018; H01S 5/5009; H01S 5/10; G02B 6/4213
See application file for complete search history.

(56) References Cited

U.S. PATENT DOCUMENTS

2013/0121632 A1 5/2013 Akutsu et al.
2018/0188456 A1* 7/2018 Tomita ................. G02B 6/4292

FOREIGN PATENT DOCUMENTS

JP H0974247 A 3/1997
JP 5791094 B2 10/2015

OTHER PUBLICATIONS

Ken Morito, and Shinsuke Tanaka, Record High Saturation Power (+22 dBm) and Low Noise Figure (5.7 dB) Polarization-Insensitive SOA Module, Dec. 27, 2004; revised Feb. 5, 2005, 3 pages.

L.F. Tiemeijer, A Single-Pass Single-Amplifier Polarization-Insensitive Semiconductor Laser Amplifier Configuration, Jan. 1994, 6 pages.

L. Aina, M. Serio, M. Mattingly, E. Hempfling, and H. Chien, Polarisation Insensitive Configuration of Semiconductor Laser Amplifier, Sep. 6, 1990, 2 pages.

(Continued)

*Primary Examiner* — Matthew Mikels
(74) *Attorney, Agent, or Firm* — Lerner David LLP

(57) ABSTRACT

Polarization-insensitive optical amplifiers are an alternative to current Erbium Doped Fiber Amplifiers, which provide wideband coverage while remaining cost and space effective for use in submarine cable applications. Polarization-insensitive optical amplifiers are an improvement to current semiconductor optical amplifier systems by providing desirable polarization-dependent gain and wideband coverage. This is achieved using polarization rotators comprised of a SOI-based waveguide and a twisted optical circuit.

18 Claims, 5 Drawing Sheets

(56) References Cited

OTHER PUBLICATIONS

Bangshan Sun, Fyodor Morozko, Patrick S. Salter, Simon Moser, Zhikai Pong, Raj B. Patel, Ian A. Walmsley, Mohan Wang, Adir Hazan, Nicolas Barré, Alexander Jesacher, Julian Fells, Chao He, Aviad Katiyi, Zhen-Nan Tian, Alina Karabchevsky and Martin J. Booth, On-Chip Beam Rotators, Adiabatic Mode Converters, and Waveplates Through Low-Loss Waveguides With Variable Cross-Sections, 2022, 15 pages.

A. Nesic, M. Blaicher, P. Marin-Palomo, C. Füllner, S. Randel, W. Freude, and C. Koos, Ultra-Broadband Polarization Beam Splitter and Rotator Based on 3D-Printed Waveguides, Jul. 2021, 20 pages.

Paolo Pintus, Fabrizio DiPasquale, and John E. Bowers, Integrated TE and TM optical circulators on ultra-low-loss silicon nitride platform, Feb. 25, 2013, 12 pages.

Search Report and Search Opinion for Italian Patent Application No. 102023000007764 dated Nov. 9, 2023. 11 pages.

Tiemeijer et al. High-Gain, High-Power 1550-nm Polarization Independent MQW Optical Amplifier. IEEE Photonics Technology Letters, vol. 8, No. 9, Sep. 1, 1996. pp. 1142-1144.

* cited by examiner

401

400

POLARIZATION-INSENSITIVE OPTICAL AMPLIFIER

CROSS-REFERENCE TO RELATED APPLICATIONS

The present application claims priority from Italian Patent Application No. 102023000007764 filed Apr. 20, 2023, the disclosure of which is hereby incorporated herein by reference.

BACKGROUND

Erbium Doped Fiber Amplifiers ("EDFAs") are one of the most used optical amplifier designs. However, they are large, expensive to produce, and have restrictive bandwidth limitations. In addition, within submarine cable applications, the space for optical amplifiers is limited. Such space restrictions typically limit the number of EDFAs that can be implemented in such environments, making the implementation of multiple EDFAs difficult. As such, the total capacity of submarine cables using EDFAs is generally limited. The total capacity of a submarine cable may be increased by increasing the number of optical fibers that an optical repeater may support. However, doing so would increase the optical repeater's size beyond the space restrictions imposed by submarine cable applications.

EDFAs typically operate in the C-band (around 4.8 THz.) However, specially configured EDFAs may cover other bands, such as the L-band (around 4.8 THz.) To cover both the C-band and L-band with EDFAs, a separate EDFA is required for each band which increases EDFA count and space occupancy of the EDFAs within the limited space available in submarine cable applications.

Semiconductor optical amplifiers (SOAs) are another type of optical amplifier that may be used as an alternative to or in conjunction with EDFAs. An SOA is a semiconductor element that amplifies an optical signal. SOAs generally have wideband coverage, including the C-band and L-band, but the performance of SOAs is typically lower than EDFAs. For example, SOAs typically have lower output power, higher noise figure, faster carrier lifetime, which increases nonlinear effects that are less prevalent, if not absent, in EDFAs, and polarization-dependent gain due to a non-circular waveguide section. These are often undesirable characteristics for an optical amplifier.

A specific kind of SOA technology, known as quantum-dot SOA, may achieve improved output power and noise figures relative to other SOAs, but this technology is typically unable to achieve adequate polarization-dependent gain (PDG). To meet a satisfactory power and noise figure, a specific architecture can be leveraged which relaxes the constraint on the single chip and addresses the issue of PDG outside of the chip parameter space.

SUMMARY

The present disclosure provides for an alternative to EDFAs using SOAs that provides a desirable polarization-dependent gain. This is accomplished by utilizing a twisted waveguide to cause polarization rotation independent from the signal wavelength. By using a twisted waveguide to cause polarization independent from the signal wavelength, the SOA operates with a polarization-dependent gain that is suitable for production while providing wideband coverage at a higher performance.

An aspect of the disclosure is directed to an optical amplification system comprising: a polarization beam splitter (PBS); an optical circulator connected to an input fiber, the PBS, and an output fiber; a 90-degree twisted polarization maintaining waveguide coupled to the polarization beam splitter; and a semiconductor optical amplifier (SOA) having two facets of input/outputs, wherein a first facet of the two facets of input/outputs is coupled to the polarization beam splitter and a second facet of the two facets of input/outputs is coupled to the 90-degree twisted waveguide.

In some instances, the 90-degree twisted polarization-maintaining waveguide is a polarization-maintaining optical fiber.

In some instances, the input fiber and the output fiber each comprise a multi-core fiber. In some examples, the input fiber is connected to a photonic integrated chip through optical wire bonding. In some examples, the 90-degree twisted waveguide is integrated into the photonic integrated chip. In some examples, the 90-degree twisted waveguide is an SOI waveguide.

In some instances, the system further includes one or more additional PBSs, each of the one or more additional PBSs being coupled to a respective one or more additional optical circulators. In some examples, the one or more additional optical circulators are each connected to the input fiber and the output fiber. In some examples, the system further comprises one or more additional 90-degree twisted polarization-maintaining waveguides, wherein each of the one or more additional 90-degree twisted polarization-maintaining waveguides are coupled to a respective one of the one or more polarization beam splitters. In some examples, the system further comprises one or more additional SOAs, wherein each of the one or more additional SOAs has two facets of input/outputs, wherein each first facet of the two facets of input/outputs is coupled to a respective one of the one or more polarization beam splitters and a second facet of the two facets of input/outputs is coupled to a respective one of the one or more 90-degree twisted waveguides.

Another aspect of the disclosure is directed to an optical amplification system comprising: a polarization beam splitter connected to an input and output fiber; two 90-degree twisted polarization maintaining waveguides, wherein coupled to the polarization beam splitters; and two semiconductor optical amplifiers (SOAs) in parallel, wherein a first SOA of the two SOAs includes two facets of input/outputs, wherein a first facet of the two facets of input/outputs is coupled to the polarization beam splitter and a second facet of the two facets of input/outputs is coupled to a first 90-degree twisted waveguide, and second SOA of the two SOAs include two facets of input/outputs wherein a first facet of the two facets of input/outputs is coupled to a second 90-degree twisted waveguide and a second facet of the two facets of input/outputs is coupled to the polarization beam splitter.

In some instances, the 90-degree twisted polarization maintaining waveguides are each a polarization maintaining optical fiber. In some examples, the input fiber and the output fiber each comprise a multi-core fiber. In some examples, the input fiber is connected to a photonic integrated chip through optical wire bonding. In some examples, the 90-degree twisted waveguides are integrated into the photonic integrated chip. In some examples, the 90-degree twisted waveguides are SOI waveguides.

In some instances, the system further includes one or more additional PBSs.

In some examples, the one or more additional PBSs are each connected to an input/output fiber. In some examples, the system further comprises one or more additional 90-degree twisted polarization-maintaining waveguides, wherein each of the one or more additional 90-degree twisted polarization-maintaining waveguides are coupled to a respective one of the one or more PBSs.

DETAILED DESCRIPTION

The present disclosure generally relates to a semiconductor optical amplification system including a twisted waveguide. The twisted waveguide may cause polarization rotation independent from the signal wavelength, thereby providing a more cost-effective alternative to currently available EDFA and SOA configurations while providing wideband coverage and high performance.

Typical SOA-based polarization-independent amplifiers use a polarization rotator to transform transverse magnetic (TM) mode into transverse electric (TE) mode (or vice-versa) for amplification. The polarization rotator functions by rotating a polarized optical signal by 90 degrees. The typical component used for this transformation is a retardation birefringent plate presenting an appropriate delay between two orthogonal directions that should be aligned with the amplified TE and TM modes. However, the operative wavelength range usable in these SOA-based amplifier designs is limited due to the rotation angle dependence on the optical frequency. Also, semiconductor optical amplifiers present an optical gain bandwidth, which may be larger than 100 nm. However, the phase delay generated by the birefringent retardation plate is proportional to $\omega\tau$ where $\omega$ is the optical frequency and $\tau$ is the delay between the two plate propagation modes. As such, the rotation angle is dependent on the optical frequency, and for larger wavelength ranges, the rotation angle may not remain 90 degrees as required to achieve even amplification across the optical wavelength range.

Another issue with typical SOA-based polarization insensible amplifiers is their general sensitivity to internal reflections which generate interferometric noise at the receiver, reducing system performances. The insertion of the birefringent retardation plate inside the SOA-based amplifiers increases the number of reflection points, therefore increasing the amount of interferometric noise in the system.

Figure 1:
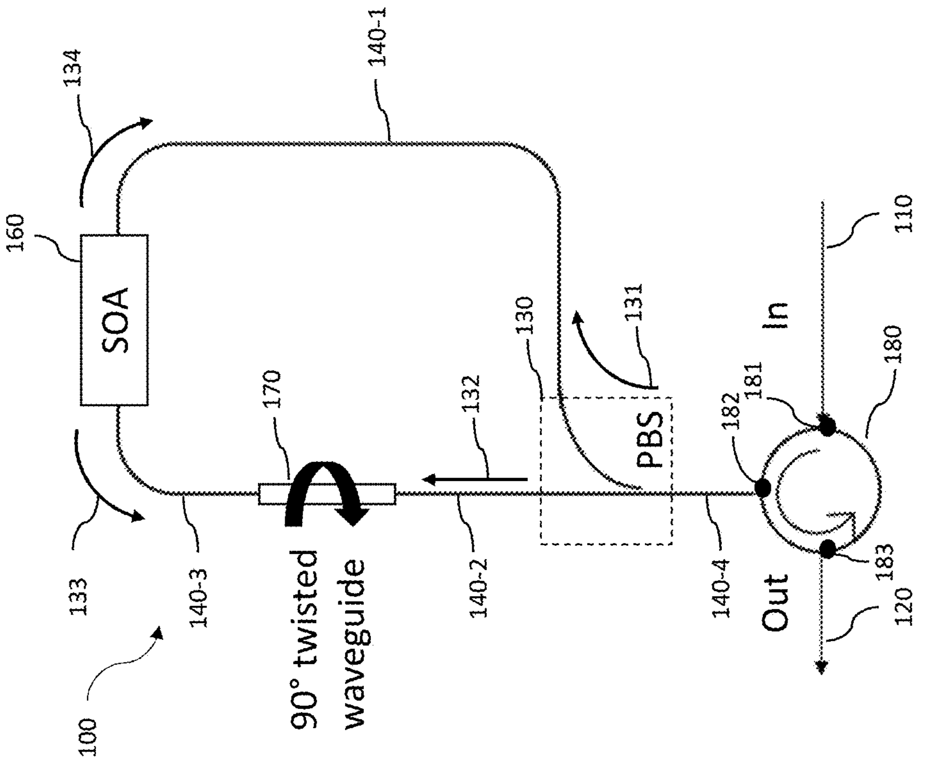
FIG. 1 depicts an example of an SOA-based polarization-insensitive optical amplifier consistent with aspects of the disclosure.

FIG. 1 illustrates an example configuration of a polarization-independent semiconductor optical amplifier configuration 100, which addresses the issues with known SOA-based polarization insensible amplifiers. In this example, the polarization-independent SOA configuration 100 consists of an optical circulator 180, input fiber 110, output fiber 120, a polarization beam splitter (PBS) 130, a polarization-dependent SOA 160, a twisted waveguide 170, and optical fibers 140-1, 140-2, 140-3, and 140-4. The optical fibers, including optical fibers 140-1, 140-2, 140-3, 140-4, input fiber 110, and output fiber 120 may be polarization-maintaining optical fibers.

As illustrated, the input fiber 110 is connected to the optical circulator 180. The optical circulator is connected to the PBS 130 via optical fiber 140-4. The PBS 130 is further connected to the SOA 160 via optical fiber 140-1 and is further connected to the twisted waveguide 170 by optical fiber 140-2. The twisted waveguide 170 is connected to the SOA 160 by optical fiber 140-3.

In operation, an optical signal may be received from input fiber 110 into the optical circulator 180. The optical circulator 180 is a device configured to receive light in one port and output it through a subsequent port. In the example illustrated in FIG. 1, the optical circulator 180 receives an optical signal from input fiber 110 at port 181. The optical circulator 180 subsequently outputs the received optical signal from port 182 into optical fiber 140-4. Optical fiber 140-4 may transmit the optical signal to the PBS 130.

The PBS may divide the optical signal into two orthogonally polarized optical signals. A first of the polarized optical signals is output onto optical fiber 140-1 to the SOA 160, as illustrated by arrow 131. The second of the polarized optical signals is output onto optical fiber 140-2 to the twisted waveguide 170, as represented by arrow 132.

The second of the polarized optical signals may traverse the twisted waveguide 170, where the second optical signal is rotated by 90 degrees. The second optical signal is then amplified by the SOA 160 and transmitted back to the PBS 130 on optical fiber 140-1, as represented by arrow 134.

The first of the polarized optical signals may also be amplified by the SOA 160. The SOA 160 may transmit the amplified first optical signal on optical fiber 140-3 to the twisted waveguide 170, as illustrated by arrow 133. The twisted waveguide 170 may rotate the first optical signal by 90 degrees, and the rotated first optical signal may then be transmitted to the PBS 130.

Although not shown, the semiconductor optical amplifier (SOA) 160 has two facets of input/outputs. The first facet of the two facets of input/outputs may be coupled to the polarization beam splitter 130 and a second facet of the two facets of input/outputs may be coupled to the 90-degree twisted waveguide 170.

The PBS may combine the amplified and rotated first and second optical signals and recombine them into a single, amplified signal. The amplified signal may then be transmitted to port 182 of the optical circulator 180. The optical circulator may then output the amplified signal onto output fiber 120 via port 183.

The polarization-independent semiconductor optical amplifier configuration 100 illustrated in FIG. 1 reduces reflecting interfaces by maintaining a 90-degree twisted waveguide 170 which together operates as a polarization rotator. This allows for the polarization rotation to remain independent from the signal wavelength and to support large wavelength range applications. By rotating the polarization independent from the signal wavelength, polarization-independent semiconductor optical amplifier configuration 100 may function without the deficiencies of other known systems, as described herein.

The twisted waveguide may be constructed using optical fiber or planar optical technology. A twisted waveguide may be constructed from an optical fiber by applying a 90-degree twist to a polarization-maintaining fiber. In this regard, the optical fiber itself may exchange the polarizations and function as the waveguide. In some instances, the twisted waveguide may be integrated into the optical wire bonding structure connecting the SOA and a PBS.

Although FIG. 1, illustrates the twisted waveguide 170 as being constructed between optical fibers 140-2 and 140-3 using a twisted optical fiber, the twisted waveguide may alternatively be positioned on optical fiber 140-1. Further, the twisted waveguide 170 may be formed at a connection with the PBS. In this regard, the twisted waveguide 170 may be formed at a connection with the PBS. In this regard, an optical fiber, such as optical fiber 140-1 may be connected to a PBS port with a rotation of 90° compared to the other optical fiber (140-2) connected to another port of the PBS.

For planar configurations, the twisted waveguides may be constructed as a silicon-on-insulator (SOI) waveguide. In this regard, a femtosecond laser may form buried twisted waveguides within a silicon layer. The twisted waveguide shown in FIG. 1 is an optical fiber twisted 90 degrees; however, other twisted waveguides may be used, such as an SOI waveguide.

Figure 2:
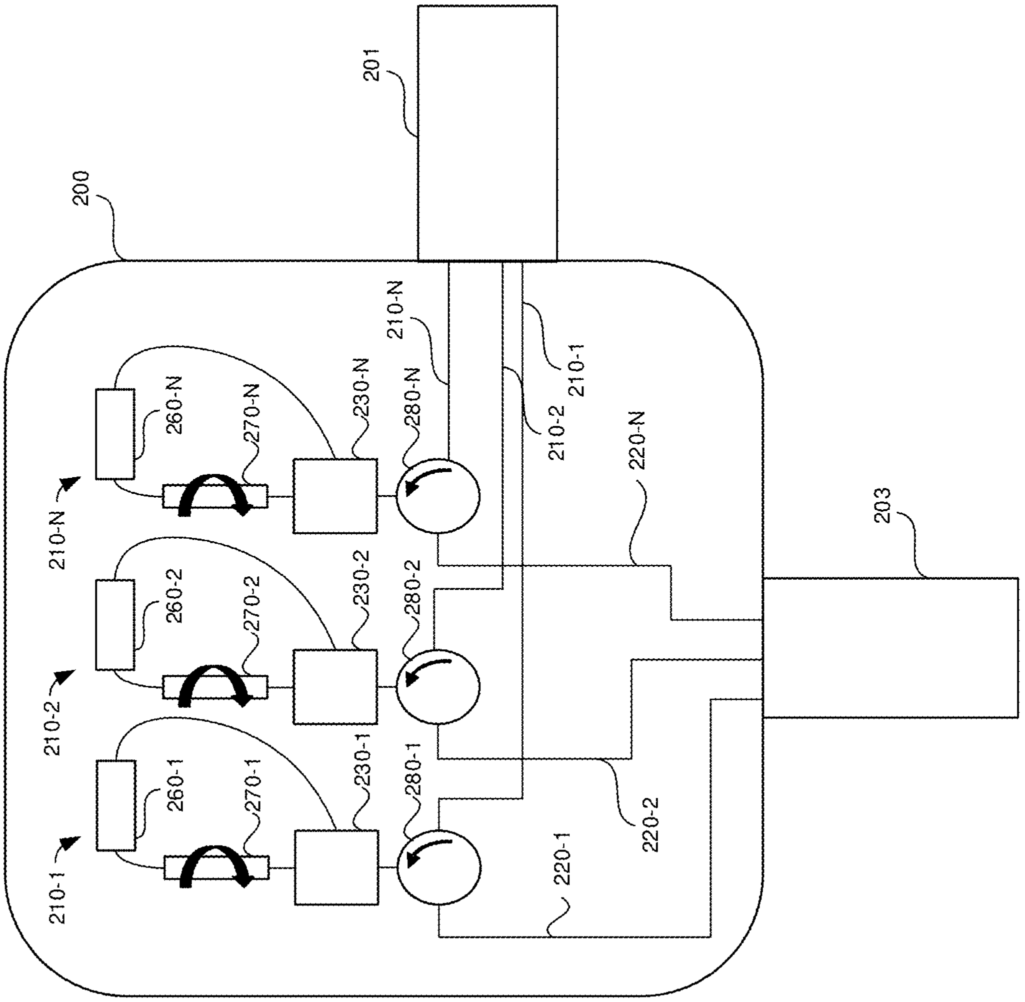
FIG. 2 depicts an example of a planar implementation of multiple SOA-based polarization-insensitive optical amplifiers consistent with aspects of the disclosure.

Single or multiple polarization-independent amplifiers may be implemented in a single chip. For instance, one or more optical circulators and PBSs may be integrated within planar technology along with one or more 90-degree twisted SOI waveguides. For example, as illustrated in FIG. 2, a single silicon chip 200, having N polarization-independent amplifiers, is connected to a multi-core input fiber 201 and multi-core output fiber 203, each having N individual optical fibers. As shown, each polarization-independent amplifier 210-1, 210-, and 210-N includes components similar to the polarization-independent semiconductor optical amplifier configuration 100. In this regard, each polarization-independent amplifier 210-1-210-N includes an optical circulator 280-1, 280-2, 280-N, a PBS 230-1, 230-2, 230-N, a twisted waveguide 270-1, 270-2, 270-N, and an SOA 260-1, 260-2, 260-N. The operation of each polarization-independent amplifier may be similar to the polarization-independent semiconductor optical amplifier configuration 100.

As further shown in FIG. 2, each individual fiber of the multi-core input fiber 201 may be connected to a respective polarization-independent amplifier. In this regard, a first fiber may be connected to optical circulator 280-1 via optical connection 220-1, a second fiber may be connected to optical circulator 280-2 via optical connection 220-2, and an "N" fiber may be connected to optical circulator 280-N via optical connection 220-N.

Each optical signal carried by a fiber of the multi-core input fiber 201 may subsequently be passed to a polarization-independent amplifier via an optical connection for amplification. For instance, an optical signal carried on a first fiber of the multi-core input fiber 201 may be passed to polarization-independent amplifier 210-1 via optical connection 220-1.

The amplified optical signals may be output to a multi-core output fiber 203 via additional optical connections. For example, optical signals amplified by polarization-independent 210-1 may be passed to a fiber of the multi-core output fiber 203 via optical connection 222-1. Similarly, optical signals amplified by polarization-independent 210-2 may be passed to a fiber of the multi-core output fiber 203 via optical connection 222-2, and optical signals amplified by polarization-independent 210-N may be passed to a fiber of the multi-core output fiber 203 via optical connection 222-N. By constructing a polarization-independent amplifier as a single chip using planar technology, such as shown in chip 200, the entire SOA configuration can be formed in an integrated chip instead of being assembled by fiber components, thereby saving space and reducing material. As further described herein, multiple polarization-independent SOAs may be implemented to provide failure protection.

Although FIG. 2 illustrates the signals carried by the cores of the multi-core fiber propagating in the same direction, as illustrated by the counter-clockwise arrows within the circulators 201-1-201-3, the signals may propagate in different directions. In this regard, the circulators 201-1-201-3 may propagate signals in a clockwise direction, counter-clockwise direction, or both directions.

Although the foregoing examples describe an SOA-based polarization-independent amplifier, the twisted waveguide may be integrated into EDWAs (Erbium Doped Waveguide Amplifier) or other polarization-sensible mediums for similar benefits as described herein with regard to the SOA-based polarization-independent amplifier.

Previous attempts at eliminating the polarization sensitivity of SOA-based amplifiers have been described. A first configuration compensated for the polarization-dependent gain of the SOA by exchanging the TE and TM modes and equalizing the gain. In this regard, two SOAs were placed back-to-back with a polarization rotator in the middle. A second configuration included using a single SOA, a mirror, and a polarization rotator coupled together to equalize the gain of the two polarizations. However, these two configurations of optical circuits have limitations since they both require that the TE and TM mode gain difference does not exceed certain limits in order to prevent impairments of the amplifier noise figure.

Figure 3A:
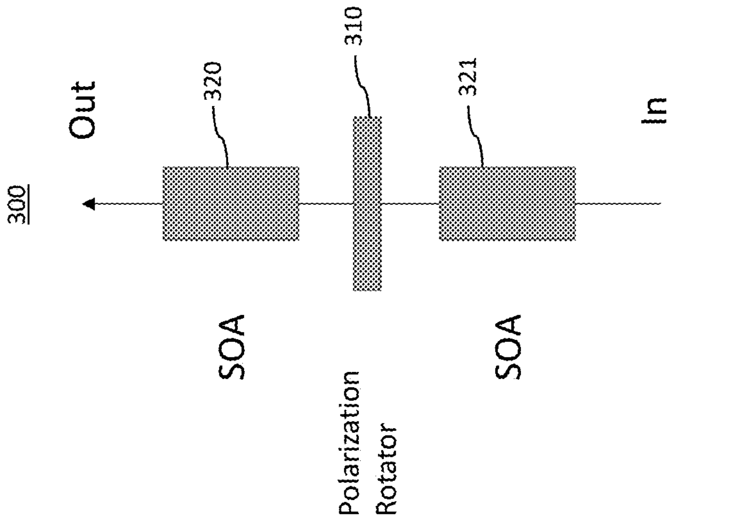
FIGS. 3A-3D illustrate example configurations of SOA-based amplifiers.

FIG. 3A illustrates an example of the first configuration 300 of an SOA-based polarization insensible amplifier in a configuration that features two SOAs 320, 321 placed back-to-back with a polarization rotator 310 in the middle. A polarization rotator 310 is an optical device that rotates linearly polarized optical signals by an angle of choice. This example functions by amplifying the optical signal as it enters the first SOA 321 to which the optical signal is then polarized at a set angle through the polarization rotator 310, and then amplified again through the second SOA 320 to achieve the desired polarization-dependent gain. However, since there are differences in the components of the first SOA 300 and the second SOA 320 there may be discrepancies in the polarization-dependent gain which would make the system unfit for production.

Figure 3B:
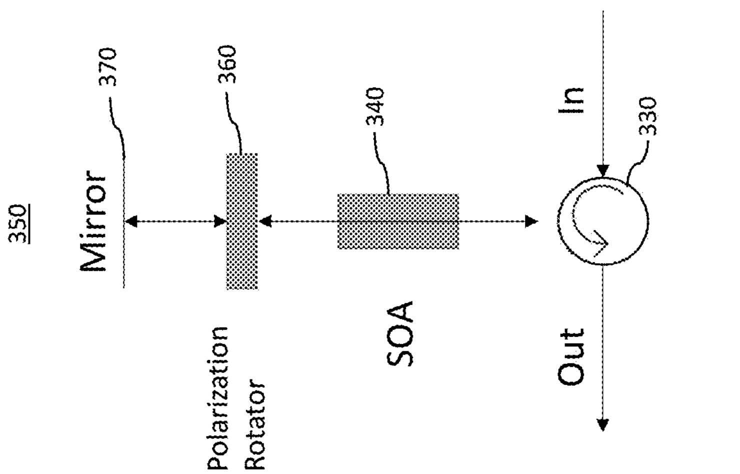

FIG. 3B illustrates an example of the second configuration 350 that includes the use of one SOA 340 with a mirror 320 and a quarter lambda polarization rotator 310 to equalize the gain of the two polarizations. This example functions in a similar way as that in FIG. 2 but utilizes one SOA 340 to amplify the optical signal. Here, the optical signal enters through the SOA 340 from an optical circulator 330, is 45° rotated through the polarization rotator 360 to which it reaches a mirror 370, and then goes back through the SOA 340 after a second 45° rotation to be amplified before leaving the system through the optical circulator 330. This configuration may eliminate issues caused by using two different SOAs, however, the condition for obtaining a usable polarization-independent amplifier is that the difference in gain between TE and TM mode in the SOA is less than 6 dB which cannot be guaranteed in production for the QD SOA.

Figure 3D:
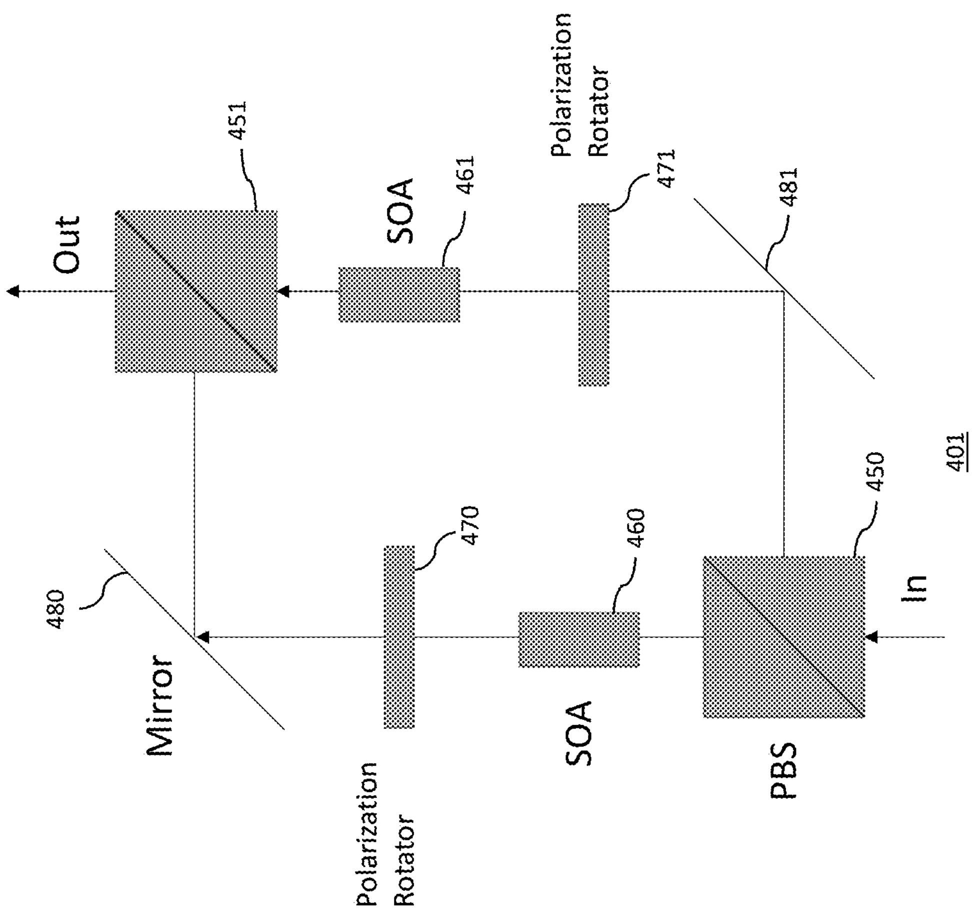
Figure 3C:
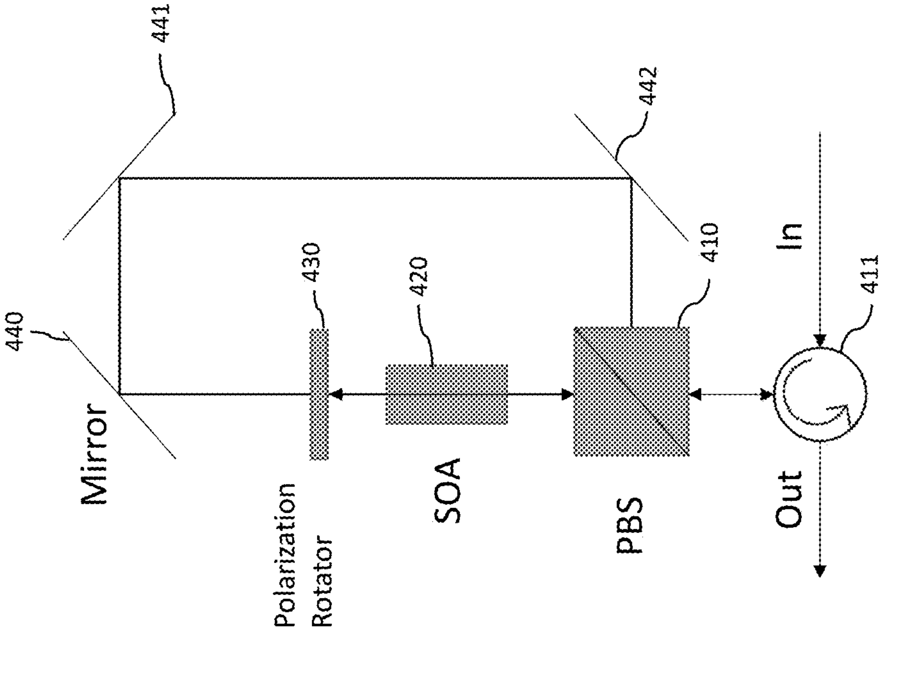

FIG. 3C and FIG. 3D illustrate alternative configurations in which the SOA operates in only one polarization. In each alternative configuration, including configuration 400 (shown in FIG. 3C) and configuration 401 (shown in FIG. 3D), SOAs are used in conjunction with PBS's such that only one polarization is processed. FIG. 3C illustrates a configuration 400 which contains an optical circulator 411, a PBS 410, one SOA 420, a polarization rotator 430, and multiple mirrors 440-442. The PBS 410 functions by dividing unpolarized optical signal into two orthogonally polarized beams such the resulting two beams are angled in two different directions. Therefore, the system functions in which the optical signal leaves the optical circulator 411 and enters the PBS 410, resulting in two bidirectional optical signals entering the SOA 420 to be amplified. The amplified optical signal is then processed through the polarization rotator, to which a set of mirrors 440-442 sends the optical signal back through the PBS 410 and out the optical circulator 411 at the desired amplification. This configuration uses a single SOA in bidirectional mode, and the two polarizations travel along the same optical path with no differential delay. However, this configuration needs a polarization rotator that has the issue of reduced bandwidth and increased reflections FIG. 3D illustrates a configuration 401 that, instead of utilizing an optical circulator for the input and output of the optical signal, two PBS's 450, 451, two SOAs 460, 461, and two polarization rotators 470, 471 are used so that the optical signal enters through one side of the system and leaves through the other. In configuration 401 the optical signal first enters one PBS 450 in which the optical signal is split into two directions, one of which is first amplified through an SOA 460 and then processed through the polarization rotator 470. The second optical signal from the PBS 450 is first processed through a different polarization rotator 471 and then amplified through a different SOA 461. The split optical signals then enter a second PBS 451 before leaving the entire system. Two mirrors 480, 481 are implemented in this configuration to direct the bidirectional optical signals in the proper directions. This configuration needs two SOAs that have to be selected to have the same gain. In addition, the two polarizations travel different optical paths. Therefore, tight tolerances are needed to avoid differential delay between the two polarizations that may introduce signal distortion. The presence of two polarization rotators limits the bandwidth and may introduce reflections that create interferometric noise in the system. Moreover, like the configuration shown in FIG. 3A, configuration 401 relies on two SOAs 460, 461, which increases design difficulties. For instance, it is difficult to align the performance across the entire bandwidth of two different SOA modules in production. This is because the performance of the two SOAs would have to match, which would require carefully selected components, which may reduce production yield and add to overall costs.

Figure 4:
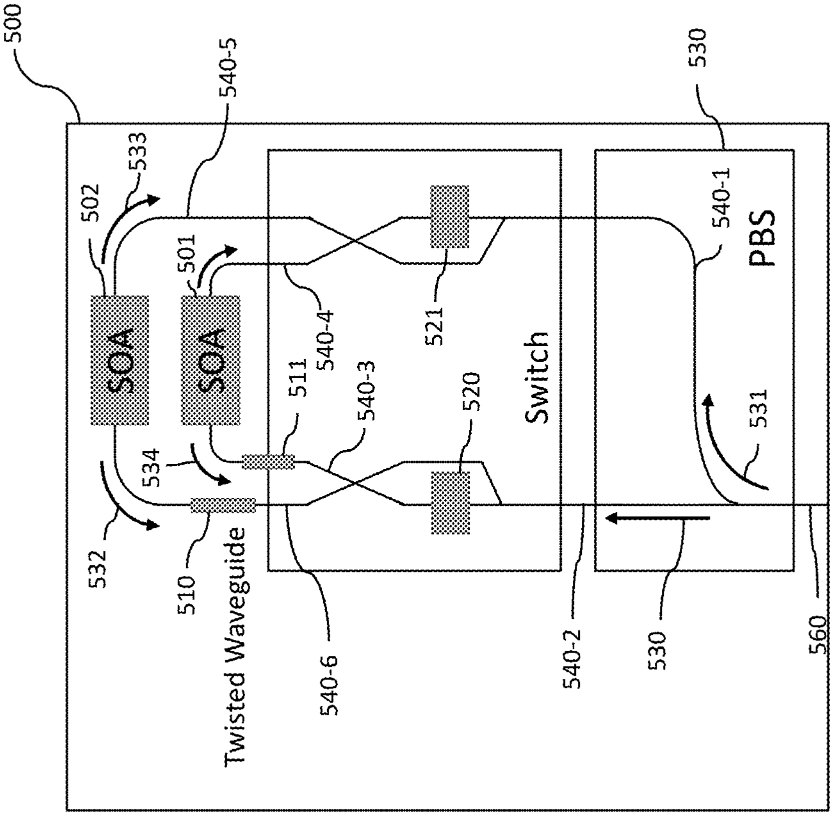
FIG. 4 is an example of two SOA-based polarization-insensitive optical amplifiers configured as a switch providing 1+1 protection consistent with aspects of the disclosure.

FIG. 4 illustrates an example of a switch configuration 500 where two polarization-independent amplifiers are configured to provide 1+1 protection of the respective components using two switches. Here, two of the configurations detailed in FIG. 1 are assembled in parallel in order to provide 1+1 protection in the event that one of the SOA fails. The configuration features two SOAs 501, 502, two twisted waveguides 510, 511, two switches 520, 521, and a polarization beam splitter 530. Although FIG. 4 illustrates the switches 520, 521 as being positioned after PBS 530, a single switch may be positioned before the PBS 530.

The switch configuration 500 may be configured such that when an optical signal enters through the optical connection 560 leading to a PBS 530, the optical signal is processed through said PBS 530 before being fed to one of two parallel semiconductor optical amplifier systems.

The PBS may divide the optical signal into two orthogonally polarized optical signals. The first of the polarized optical signals is output onto optical fiber 540-1 to switch 521, as illustrated by arrow 531. When switch 521 is closed, the first polarized optical signal traverses SOA 501. The second of the polarized optical signals is output onto optical fiber 540-2 to the switch 520 as represented by arrow 530.

When switch 520 is closed, the second of the polarized optical signals may traverse the twisted waveguide 511, where the second optical signal is rotated by 90 degrees. The second optical signal is then amplified by the SOA 501 and transmitted back to the PBS 530 on optical fiber 540-4, as represented by arrow 501.

When the switch 521 is closed, the first of the polarized optical signals may also be amplified by the SOA 501. The SOA 501 may transmit the amplified first optical signal on optical fiber 540-3 to the twisted waveguide 511, as illustrated by arrow 534. The twisted waveguide 511 may rotate the first optical signal by 90 degrees, and the rotated first optical signal may then be transmitted to the PBS 530 by optical fiber 540-2.

When switch 520 is open, the second of the polarized optical signals may traverse the twisted waveguide 510, where the second optical signal is rotated by 90 degrees. The second optical signal is then amplified by the SOA 502 and transmitted back to the PBS 530 on optical fiber 540-5, as represented by arrow 502.

When switch 521 is open, the first of the polarized optical signals may also be amplified by the SOA 502. The SOA 502 may transmit the amplified first optical signal on optical fiber 540-6 to the twisted waveguide 510, as illustrated by arrow 532. The twisted waveguide 510 may rotate the first optical signal by 90 degrees, and the rotated first optical signal may then be transmitted to the PBS 530 by optical fiber 540-2.

The switch configuration 500 may ensure that if a component or components fail, the amplifier will still operate. The failure of the SOA 501 or twisted waveguide 511 may trigger the switch to open, which will then send the optical signal along the path containing SOA 502 and twisted waveguide 510, which may be fully operating. Therefore, if either SOA 501 or twisted waveguide 511 fail, and SOA 502 and twisted waveguide 510 are fully functioning, the circuit will continue to operate at full capacity.

Although the example in FIG. 4 shows a switch configuration 500 made up of two SOA-based polarization-independent amplifier systems, the invention is not limited to such a configuration, and the switch configuration may contain any number of SOA-based polarization-independent amplifiers.

While the above-detailed description has shown, described, and pointed out features as applied to various embodiments, it will be understood that various omissions, substitutions, and changes in the form and details of the devices illustrated can be made without departing from the scope of the disclosure. As will be recognized, certain embodiments of the inventions described herein can be embodied within a form that does not provide all of the features and benefits set forth herein, as some features can be used or practiced separately from others.

Unless otherwise stated, the foregoing alternative examples are not mutually exclusive but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including,"

and the like, should not be interpreted as limiting the subject matter of the claims to the specific examples; rather, the examples are intended to illustrate only one of many possible examples. Further, the same reference numbers in different drawings can identify the same or similar elements.

The invention claimed is:

1. An optical amplification system comprising:

a polarization beam splitter (PBS);

an optical circulator connected to an input fiber, the PBS, and an output fiber, wherein the input fiber and the output fiber each comprise a multi-core fiber;

a 90-degree twisted polarization maintaining waveguide coupled to the polarization beam splitter; and a semiconductor optical amplifier (SOA) having two facets of input/outputs, wherein a first facet of the two facets of input/outputs is coupled to the polarization beam splitter and a second facet of the two facets of input/outputs is coupled to the 90-degree twisted waveguide.

2. The system of claim 1, wherein the 90-degree twisted polarization-maintaining waveguide is a polarization-maintaining optical fiber.

3. The system of claim 1, wherein input fiber is connected to a photonic integrated chip through optical wire bonding.

4. The system of claim 3, wherein the 90-degree twisted waveguide is integrated into the photonic integrated chip.

5. The system of claim 4, wherein the 90-degree twisted waveguide is an SOI waveguide.

6. The system of claim 1, wherein the system further includes:

one or more additional PBSs, each of the one or more additional PBSs being coupled to a respective one or more additional optical circulators.

7. The system of claim 6, wherein the one or more additional optical circulators are each connected to the input fiber and the output fiber.

8. The system of claim 7, further comprising one or more additional 90-degree twisted polarization maintaining waveguides, wherein each of the one or more additional 90-degree twisted polarization maintaining waveguides are coupled to a respective one of the one or more polarization beam splitters.

9. The system of claim 8, further comprising one or more additional SOAs, wherein each of the one or more additional SOAs has two facets of input/outputs, wherein each first facet of the two facets of input/outputs is coupled to a respective one of the one or more polarization beam splitters and a second facet of the two facets of input/outputs is coupled to a respective one of the one or more 90-degree twisted waveguides.

10. An optical amplification system comprising:

a polarization beam splitter connected to an input fiber and output fiber;

two 90-degree twisted polarization maintaining waveguides, wherein the two 90-degree twisted polarization maintaining waveguides are coupled to the polarization beam splitter; and two semiconductor optical amplifiers (SOAs) in parallel, wherein a first SOA of the two SOAs includes two facets of input/outputs, wherein a first facet of the two facets of input/outputs is coupled to the polarization beam splitter and a second facet of the two facets of input/outputs is coupled to a first 90-degree twisted waveguide, and wherein a second SOA of the two SOAs includes two facets of input/outputs wherein a first facet of the two facets of input/outputs is coupled to a second 90-degree twisted waveguide and a second facet of the two facets of input/outputs is coupled to the polarization beam splitter.

11. The system of claim 10, wherein the 90-degree twisted polarization maintaining waveguides are each a polarization maintaining optical fiber.

12. The system of claim 10, wherein the input fiber and the output fiber each comprise a multi-core fiber.

13. The system of claim 12, wherein input fiber is connected to a photonic integrated chip through optical wire bonding.

14. The system of claim 13, wherein the 90-degree twisted waveguides are integrated into the photonic integrated chip.

15. The system of claim 14, wherein the 90-degree twisted waveguides are SOI waveguides.

16. The system of claim 10, wherein the system further includes:

one or more additional PBSs.

17. The system of claim 16, wherein the one or more additional PBSs are each connected to an input/output fiber.

18. The system of claim 17, further comprising one or more additional 90-degree twisted polarization maintaining waveguides, wherein each of the one or more additional 90-degree twisted polarization maintaining waveguides are coupled to a respective one of the one or more PBSs.

* * * * *